United States Patent
Yun et al.

(10) Patent No.: US 6,780,777 B2
(45) Date of Patent: Aug. 24, 2004

(54) METHOD FOR FORMING METAL LAYER OF SEMICONDUCTOR DEVICE

(75) Inventors: Jong-ho Yun, Suwon (KR); Sung-gon Jin, Icheon (KR); Ku-young Kim, Icheon (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 33 days.

(21) Appl. No.: 10/154,078

(22) Filed: May 23, 2002

(65) Prior Publication Data

US 2002/0175140 A1 Nov. 28, 2002

(30) Foreign Application Priority Data

May 23, 2001 (KR) .......................................... 2001-28492

(51) Int. Cl.$^7$ .......................................... H01L 21/302
(52) U.S. Cl. ....................... 438/706; 438/710; 438/712; 438/720; 216/57; 216/67
(58) Field of Search ................................ 438/706, 710, 438/712, 720; 216/57, 58, 67

(56) References Cited

U.S. PATENT DOCUMENTS

| | | | |
|---|---|---|---|
| 5,200,030 A | | 4/1993 | Cho et al. .................... 156/657 |
| 5,665,657 A | * | 9/1997 | Lee .............................. 438/624 |
| 5,731,246 A | * | 3/1998 | Bakeman et al. ............ 438/770 |
| 6,002,175 A | * | 12/1999 | Maekawa ..................... 257/760 |
| 6,217,721 B1 | * | 4/2001 | Xu et al. ................ 204/192.17 |
| 6,486,555 B2 | * | 11/2002 | Asahina et al. .............. 257/751 |

\* cited by examiner

Primary Examiner—Lan Vinh
(74) Attorney, Agent, or Firm—Marshall, Gerstein & Borun LLP

(57) ABSTRACT

The disclosure pertains to a method for forming a metal layer of a semiconductor device including the steps of: removing a residual native oxide from a contact hole forming a metal junction layer on this contact hole to improve the junction with an inter-layer insulating film, forming a first metal layer in the contact hole to a predetermined thickness under a low pressure to improve step coverage, and forming a second metal layer to a predetermined thickness, thereby planarizing the metal layer. As a result, the step coverage of the bottom surface and side walls of the contact hole is improved, thus preventing defects caused by the disconnection of metal wire of a semiconductor device and improving the economy of the process.

22 Claims, 6 Drawing Sheets

METHOD FOR FORMING METAL LAYER OF SEMICONDUCTOR DEVICE

BACKGROUND OF THE DISCLOSURE

1. Field of the Disclosure

The disclosure relates to a method for flatly stacking a metal layer of a semiconductor device, and more particularly, to a method for forming a metal layer of a semiconductor device.

2. Description of Related Technology

Generally, as the integrity of a semiconductor device increases, the contact area decreases and the aspect ratio representing a degree of inclination of an etching portion increases. Usually, as the area of a contact hole decreases and the aspect ratio increases, the step coverage of a portion such as a contact hole decreases. Thus, the flow of the current becomes worse and a resistance value becomes lower, thereby degrading the reliability of the semiconductor device.

The process temperature, electric power, pressure, etc. are factors affecting the step coverage of the metal layer in methods depositing a metal layer on the contact hole. Although the step coverage of the metal layer can be enhanced by adjusting electric power and pressure, this process has some restrictions. Particularly, the step coverage can be adjusted with the temperature. However, if the temperature is too high, metal stacked on the side walls of the contact hole is diffused to another portion (e.g., inter-layer insulating film) and thus a metallic line is disconnected. On the contrary, if the temperature is low, the metallic line is connected, but the step coverage is increased due to a shadowing effect making the flow of metal worse.

In this way, by a metal contact process for a highly integrated memory device of 256 megabytes or more, tungsten (W) is deposited in the contact hole by a CVD (chemical vapor deposition) process and then the resulting tungsten layer is planarized by an etch-back process.

However, in the process for stacking a tungsten layer in the contact hole and planarizing the same by the etch-back process, there are problems such as that a large number of steps are required and thus the unit cost is high, and the etch-back process is not controlled precisely and thus the tungsten layer is excessively etched.

In addition, the resistance of tungsten is relatively larger compared to that of aluminum or copper, so the contact resistance is high.

SUMMARY OF THE DISCLOSURE

Therefore, the disclosure provides a method for forming a metal layer of a semiconductor device. The disclosed method may also improve step coverage of the bottom surface and side walls of the contact hole.

The disclosed method may prevent defects caused by the disconnection of metal wire of a semiconductor device, and be economical.

The disclosed method includes the steps of continuously forming a lower conductive layer and an inter-layer insulating film on a wafer having a predetermined substructure; forming a contact hole by etching a predetermined portion of the interlayer insulating film whereby the lower conductive layer is exposed; removing moisture contained in the contact hole and the inter-layer insulating film of the wafer by degassing; forming a metal junction layer on an entire surface of the contact hole and the inter-layer insulating film thereby connected to the lower conductive film; forming a first metal layer on the metal junction layer; forming a second metal layer on the first metal layer; and forming a pattern by masking etching after coating an anti-reflection film on the second metal layer.

BRIEF DESCRIPTION OF THE DRAWINGS

The disclosed method will be described below, with reference to the accompanying drawings, in which.

DETAILED DESCRIPTION

The inter-layer insulating film is preferably a SOG (spin-on-glass) film, a HSQ (hydrogen silsesquioxane) film, a HDP (high density plasma) oxide film, or any other IMD film.

The metal junction layer is preferably titanium, titanium alloy, a titanium nitride layer, or a titanium/titanium nitride layer.

The first metal layer and the second metal layer are preferably aluminum or aluminum alloy.

The first metal layer is preferably deposited with a DC power of about 1 KW to about 20 KW, at an inert gas supply amount of about 1 sccm to about 500 sccm, at a heater temperature of below 400° C., and under a process pressure of below 0.5 mTorr. Most preferably, the heater temperature is an ambient temperature and the temperature of the wafer is increased in the range of about 200° C. to about 300° C. by the plasma.

The second metal layer is preferably deposited with a DC power of about 1 KW to about 20 KW and at an inert gas supply amount of about 1 sccm to about 1000 sccm.

Figure 1:
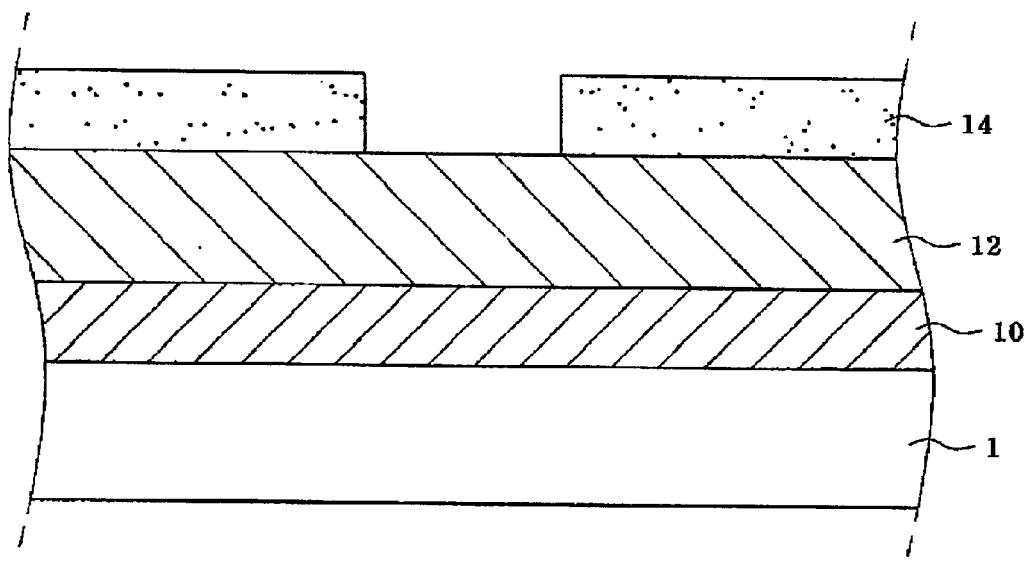
FIG. 1 is a view illustrating the state in which a lower conductive layer and an inter-layer insulating film are coated on a wafer.

As illustrated in FIG. 1, a lower conductive layer 10 and an inter-layer insulating film 12 are continuously coated on a wafer 1 having a predetermined substructure, and thereafter a photoresist film 14 is formed on the inter-layer insulating film 12 so that a portion at which a contact hole is to be formed can be opened.

Figure 9:
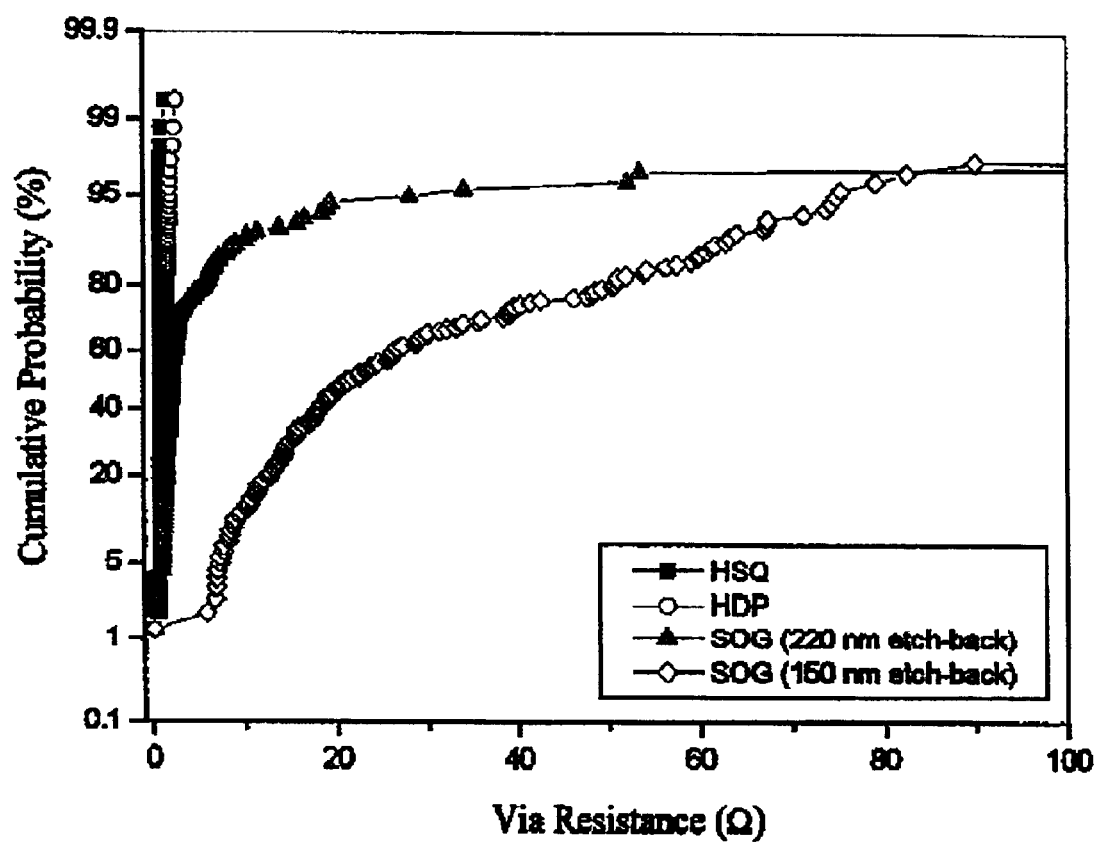
FIG. 9 is a graph illustrating the cumulative probability of a contact resistance (via resistance) according to the types of inter-layer insulating films; and, FIGS. 10a through 10d are photographs illustrating the characteristics of the state in which the first and second metal layers are buried according to the inter-layer insulating film.

As illustrated in FIG. 9, a graph shows chain resistance when a SOG film, a HSQ film, or a HDP oxide film is used as the inter-layer insulating film 12. In this graph, statistically tested samples are taken as 100% in total. In case of the HSQ film, 100% of HSQ films have a low resistance. On the other hand, the SOG film has a broad range of resistances between 1 Ω and 100 Ω.

At this point, in the case the etch-back thickness of the SOG film is increased from 150 nm to 220 nm, the resistance and its distribution is more or less improved.

In the case of the SOG film, it is preferably etched by an etch-back process so that it has a remaining thickness of about 500 Å to about 4000 Å.

Figure 2:
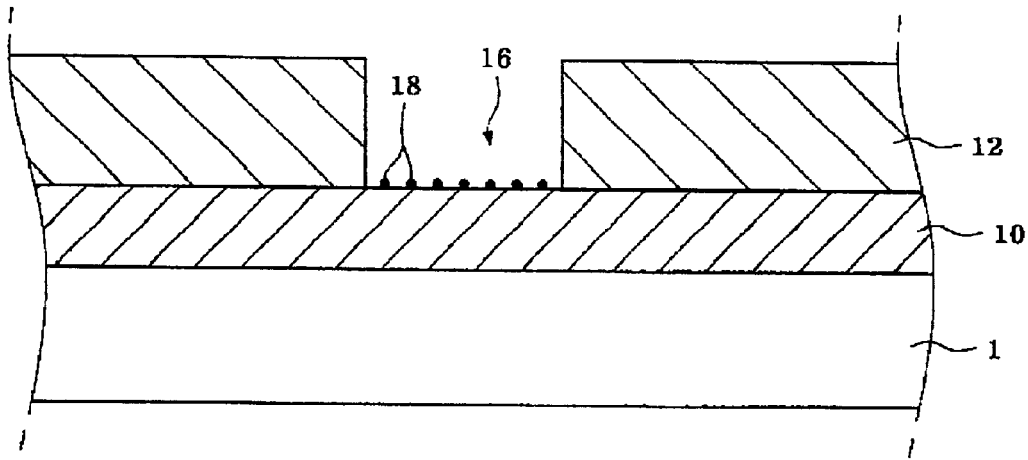
FIG. 2 is a view illustrating the state in which a contact hole is formed on the inter-layer insulating film and a portion of the lower conductive layer is exposed.

As illustrated in FIG. 2, the inter-layer insulating film 12 is etched by using the photoresist film 14 by a contact mask etching process, and then the lower conductive layer 10 is exposed, thereby forming a contact hole 16.

Moisture contained in the contact hole 16 and the inter-layer film 12 of the wafer is removed by degassing.

At this time, on the lower conductive layer 10 exposed to the bottom surface of the contact hole 16, a small-sized native oxide 18 is formed.

Figure 3:
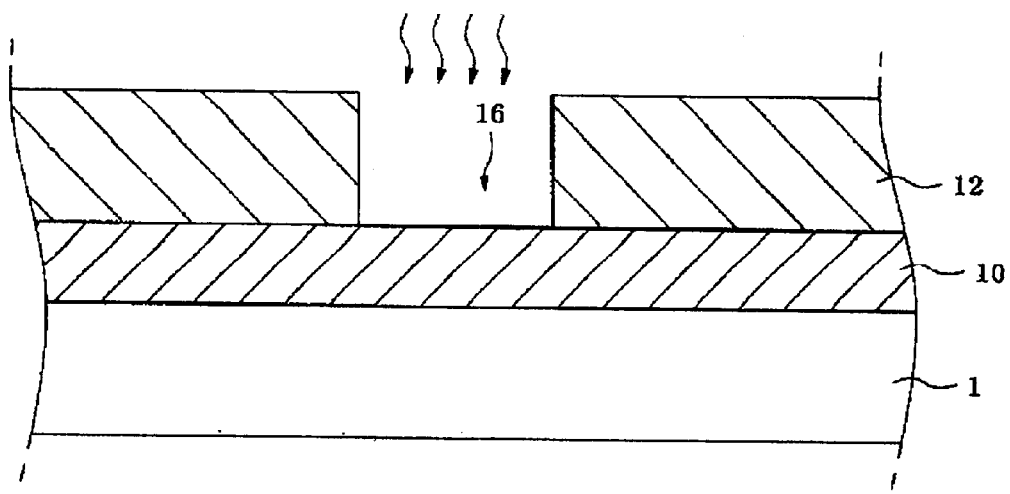
FIG. 3 is a view illustrating the state in which a RF plasma etching process for removing a native oxide from a contact hole is carried out.

As illustrated in FIG. 3, RF plasma etching may be conducted to remove the native oxide 18.

Figure 4:
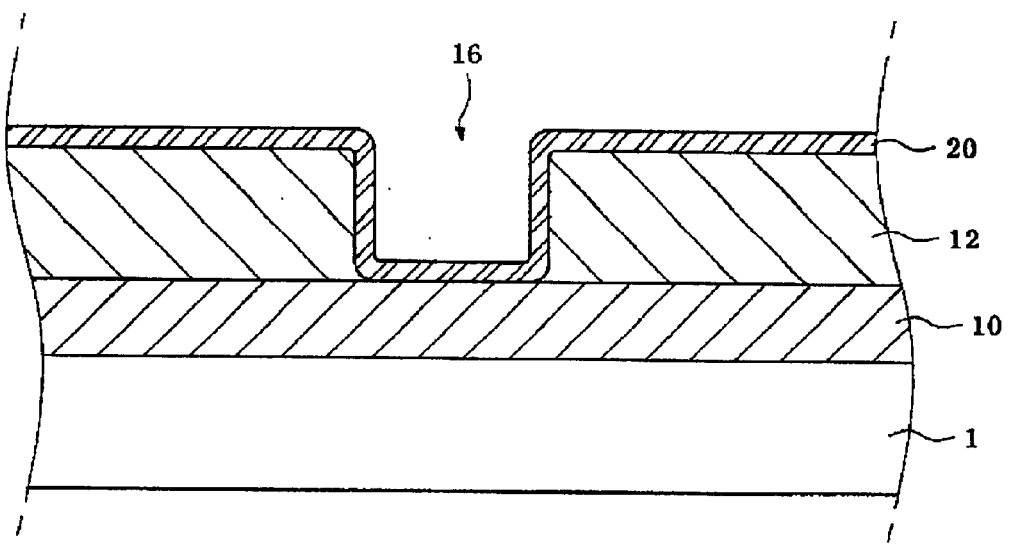
FIG. 4 is a view illustrating the state in which a metal junction layer is coated in the contact hole and on the upper portion of an insulating film.

As illustrated in FIG. 4, a metal junction layer 20 is formed on the entire surface of the contact hole 16 and the inter-layer insulating film 12 of the wafer 1 so that it can be connected to the lower conductive layer 10. This metal junction layer 20 serves to improve the junction properties so that metal wire stacked on the inter-layer insulating film 12 and the lower conductive layer 10 makes junctions easily.

As the metal junction layer 20, titanium, titanium alloy, a titanium nitride layer or a titanium/titanium nitride layer is preferably used.

The metal junction layer 20 is formed to a stacking thickness of about 300 Å to about 1000 Å, with a DC power of about 5 KW to about 20 KW, at an inert gas supply amount of about 10 sccm to about 200 sccm, at a temperature of about 5° C. to about 400° C., and under a pressure of about 20 mTorr to about 100 mTorr.

Then, it is preferable that the DC power is 12 KW, the argon is supplied as inert gas at a flow rate of about 50 sccm to about 100 sccm, the temperature is about 200° C. to about 300° C., and the pressure is about 40 mTorr to about 60 mTorr.

And when the metal junction layer 20 is coated, the temperature of a first chamber preferably starts from room temperature.

Figure 5:
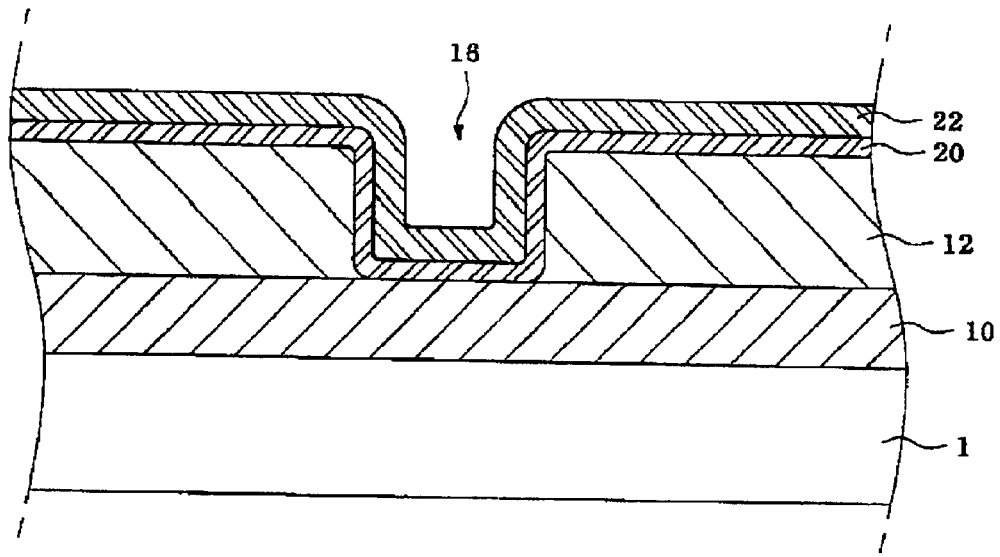
FIG. 5 is a view illustrating the state in which a first metal layer is coated on the upper portion of the metal junction layer.

As illustrated in FIG. 5, the wafer 1 with a resultant structure of a stack of the metal junction layer 20 is moved to a second chamber in order to form a first metal layer 22 on the metal junction layer 20 with a predetermined temperature and a low pressure.

The first metal layer 22 is deposited under the following conditions: a deposition thickness of about 2500 Å to about 3000 Å, a DC power of about 1 KW to about 20 KW, argon supplied as inert gas at a flow rate of about 1 sccm to about 500 sccm, the temperature of about 10° C. to about 400° C., and a pressure of about 0.01 mTorr to about 0.7 mTorr. In particular, the deposition pressure is preferably about 0.01 mTorr to about 0.5 mTorr.

And when the first metal layer 22 is coated, the temperature of the second chamber starts from room temperature and the temperature of the wafer 1 is increased up to about 200° C. to about 300° C. by plasma.

Then, after coating the first metal layer 22, the resultant wafer having the first metal layer 22 can be cooled at room temperature in order to lower an increased temperature.

Figure 6:
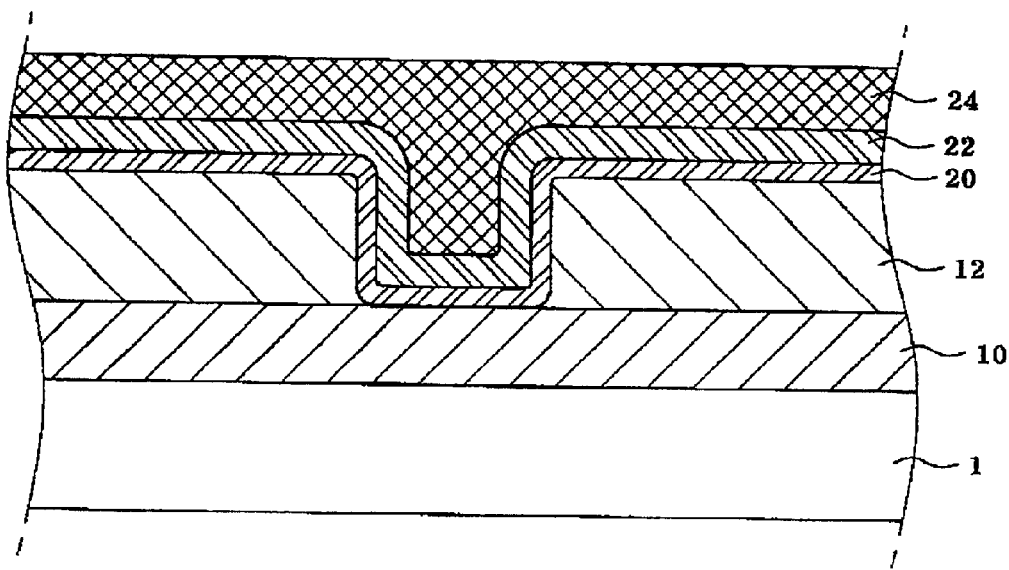
FIG. 6 is a view illustrating the state in which a second metal layer is coated on the upper portion of the first metal layer.

As illustrated in FIG. 6, in the condition that the wafer 1 with a resultant structure having the first metal layer 22 remains in the same chamber (second chamber) as it is, a second metal layer 24 is formed on the first metal layer 22 with a predetermined temperature and pressure.

At this point, before depositing the second metal layer, the cooled wafer 1 can be preheated with a temperature of about 200° C. to about 300° C. for about 10 seconds to about 300 seconds.

The second metal layer 24 is preferably deposited under the following conditions: a DC power of about 1 KW to about 20 KW, argon supplied as inert gas at a flow rate of about 1 sccm to about 1000 sccm, and a temperature of about 450° C. to about 550° C.

After forming the second metal layer 24, it can be cooled at room temperature.

Figure 7:
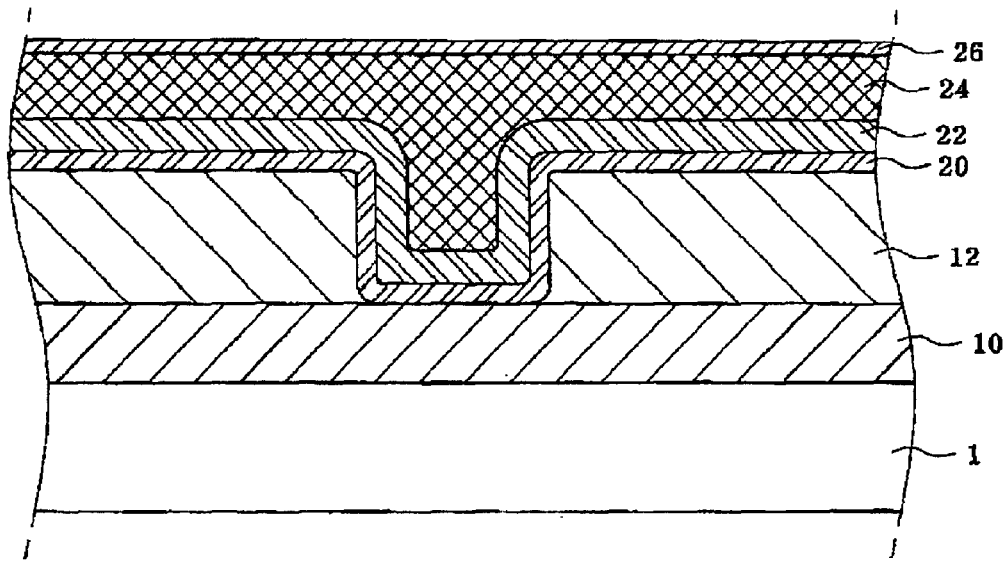
FIG. 7 is a view illustrating the state in which an antireflection film is coated on the upper portion of the second metal layer.
Figure 8:
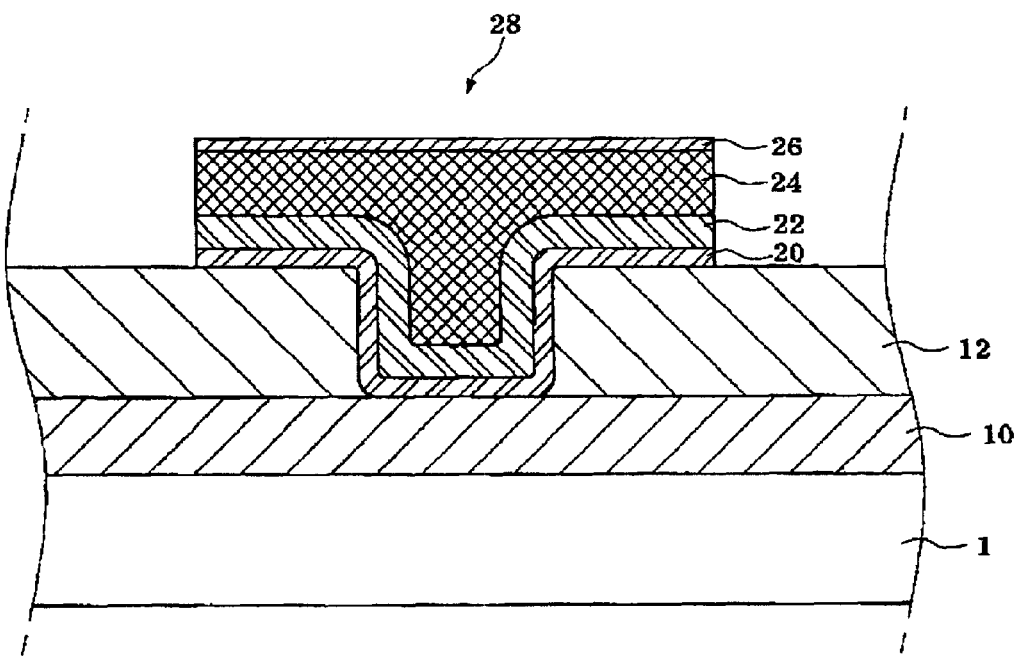
FIG. 8 is a view illustrating the state in which the metal layer, first and second metal layers and antireflection film are etched to form a pattern.

As illustrated in FIG. 7 and FIG. 8, the resultant material is moved to a predetermined chamber and then an antireflection film 26 is coated on the wafer 1 of the resultant material. A pattern 28 is subsequently formed by masking etching.

Figure 10:
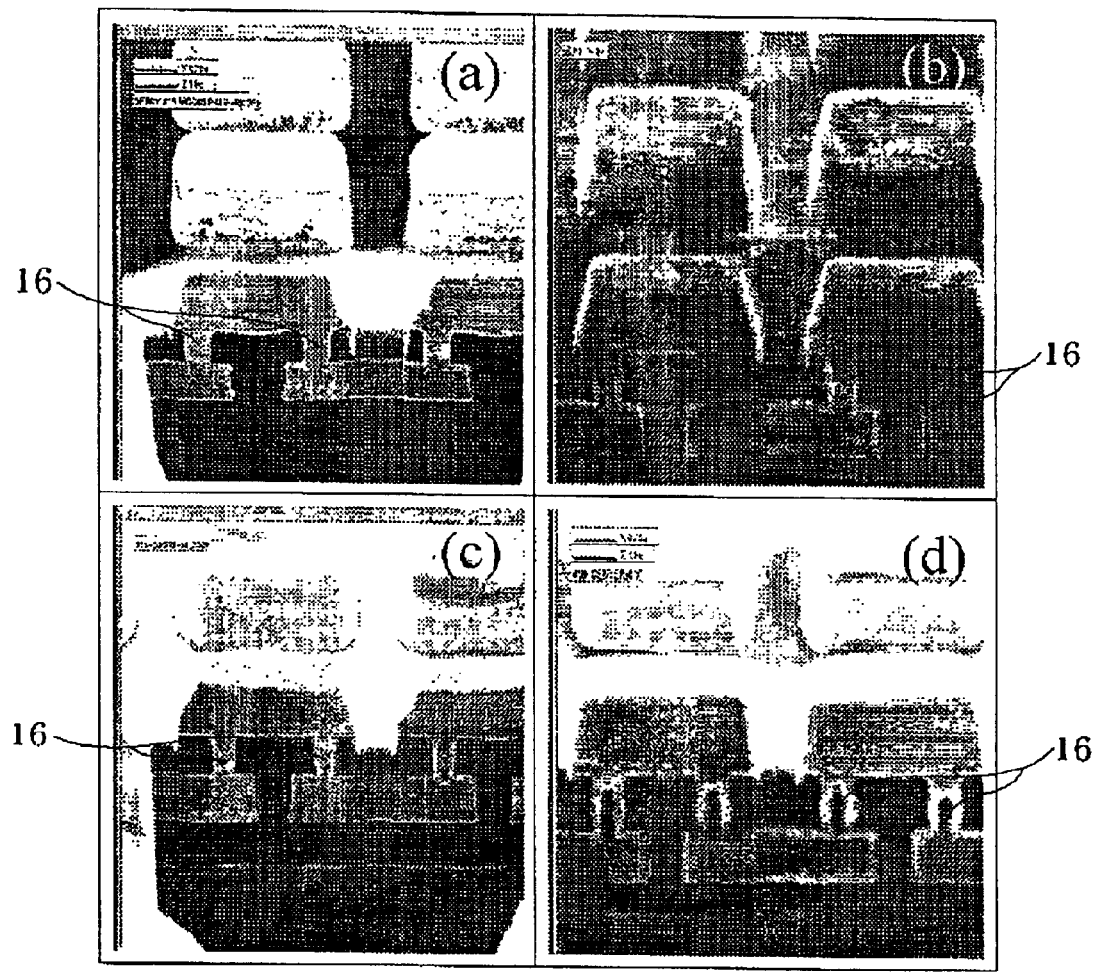

FIGS. 10a through 10d shows the burial characteristics of the first metal layer 22 and the second metal layer 24 according to the inter-layer insulating film. FIG. 10a shows the case of using a HSQ film as the inter-layer insulting film 12. FIG. 10b shows the case of using a HDP oxide film as the inter-layer insulating film 12. FIG. 10c shows a case of using a SOG film as the inter-layer insulting film 12 and conducting a 220 nm etch-back process. FIG. 10d shows a case of using a SOG film as the inter-layer insulating film 12 and conducting a 150 nm etch-back process.

In comparison between FIG. 10c and FIG. 10d, in case of using the SOG film, the burial and planarization process of the contact hole 16 is smoothly performed when the 220 nm etch-back process is performed.

Accordingly, as described above, in the disclosed method for forming a metal layer of a semiconductor device, a residual native oxide from a contact hole is removed preferably by RF plasma etching, a metal junction layer is coated on this contact hole to improve the junction with an inter-layer insulating film, a first metal layer is coated in this contact hole at a predetermined thickness under a low pressure to improve step coverage, and then a second metal layer is coated to a predetermined thickness, thereby planarizing the metal layer. Therefore, the step coverage of the bottom surface and side walls of the contact hole is improved, thus preventing defect caused by the disconnection of metal wire of a semiconductor device and improving economical effect.

What is claimed is:

1. A method for forming a metal layer of a semiconductor device, comprising the steps of:
   continuously forming a lower conductive layer on a wafer having a predetermined substructure and an inter-layer insulating film on the lower conductive layer;
   forming a contact hole by etching a predetermined portion of the inter-layer insulating film whereby the lower conductive layer is exposed;

removing moisture contained in the contact hole and the inter-layer insulating film of the wafer by degassing;

forming a metal junction layer on an entire surface of the contact hole and the inter-layer insulating film thereby being connected to the lower conductive film;

forming a first aluminum or aluminum alloy layer on the metal junction layer;

forming a second aluminum or aluminum alloy layer on the first aluminum or aluminum alloy layer;

coating an anti-reflection film on the second aluminum or aluminum alloy layer; and, forming a pattern by masking etching on the second aluminum or aluminum alloy layer.

2. The method of claim 1, comprising forming the metal junction layer with a material selected from the group consisting of titanium, titanium alloys, titanium nitride layers, and titanium/titanium nitride layers.

3. The method of claim 1, comprising forming the metal junction layer at a temperature of at least room temperature.

4. The method of claim 1, comprising depositing the first aluminum or aluminum alloy layer to a thickness of about 2500 Å to about 3000 Å.

5. The method of claim 1, comprising depositing the first aluminum or aluminum alloy layer at a temperature of at least room temperature.

6. The method of claim 1, wherein the method further comprises cooling the wafer at room temperature after forming the first aluminum or aluminum alloy layer.

7. The method of claim 1, wherein the method further comprises preheating the wafer at a temperature of about 200° C. to about 300° C. for about 10 seconds to about 300 seconds before forming the second aluminum or aluminum alloy layer.

8. The method of claim 1, comprising depositing the second aluminum or aluminum alloy layer at a deposition temperature of about 450° C. to about 550° C.

9. The method of claim 1, wherein the method further comprises cooling the second aluminum or aluminum alloy layer at room temperature after forming the second aluminum or aluminum alloy layer.

10. The method of claim 1, wherein the anti-reflection film is formed of titanium/titanium nitride film.

11. The method of claim 1, wherein the inter-layer insulating film is formed with a material selected from the group consisting of SOG film, HSQ film, and HDP film.

12. The method of claim 11, wherein the inter-layer insulating film is SOG film, and the method comprises etching the SOG film by an etch-back process whereby the SOG film has a remaining thickness of about 500 Å to about 4000 Å.

13. The method of claim 1, wherein the method further comprises a step of performing etching thereby removing a residual native oxide from the lower conductive layer exposed to the bottom surface of the contact hole after degassing.

14. The method of claim 13, comprising removing the native oxide by RF plasma etching.

15. The method of claim 1, comprising forming the metal junction layer to a thickness of about 300 Å to about 1000 Å, using a DC power of about 5 KW to about 20 KW, at an inert gas supply amount of about 10 sccm to about 200 sccm, at a temperature of about 5° C. to about 400° C., and under a pressure of about 20 mTorr to about 100 mTorr.

16. The method of claim 15, comprising forming the metal junction layer using a DC power of 12 KW, at an inert gas supply amount of about 50 sccm to about 100 sccm, at a temperature of about 200° C. to about 300° C., and under a pressure of about 40 mTorr to about 60 mTorr.

17. The method of claim 1, comprising depositing the first aluminum or aluminum alloy layer using a DC power of about 1 KW to about 20 KW, at an inert gas supply amount of about 1 sccm to about 500 sccm, and at a temperature of about 10° C. to about 400° C.

18. The method of claim 17, wherein the inert gas is argon.

19. The method of claim 1, comprising depositing the first aluminum or aluminum alloy layer under a pressure of about 0.01 mTorr to about 0.7 mTorr.

20. The method of claim 19, wherein the pressure is about 0.01 mTorr to about 0.5 mTorr.

21. The method of claim 1, comprising depositing the second aluminum or aluminum alloy layer using a DC power of about 1 KW to about 20 KW and at an inert gas supply amount of about 1 sccm to about 1000 sccm.

22. The method of claim 21, wherein the inert gas is argon.

* * * * *